United States Patent
Natarajan et al.

(10) Patent No.: US 11,237,732 B2
(45) Date of Patent: Feb. 1, 2022

(54) METHOD AND APPARATUS TO IMPROVE WRITE BANDWIDTH OF A BLOCK-BASED MULTI-LEVEL CELL NONVOLATILE MEMORY

(71) Applicant: Intel Corporation, Santa Clara, CA (US)

(72) Inventors: Shankar Natarajan, Folsom, CA (US); Suresh Nagarajan, Folsom, CA (US); Yihua Zhang, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 199 days.

(21) Appl. No.: 16/532,996

(22) Filed: Aug. 6, 2019

(65) Prior Publication Data

US 2019/0361614 A1 Nov. 28, 2019

(51) Int. Cl.
*G06F 3/06* (2006.01)
*G11C 11/56* (2006.01)
*G11C 16/04* (2006.01)

(52) U.S. Cl.
CPC .......... *G06F 3/0613* (2013.01); *G06F 3/0659* (2013.01); *G06F 3/0679* (2013.01); *G11C 11/5628* (2013.01); *G11C 16/0483* (2013.01)

(58) Field of Classification Search
CPC ...... G06F 3/061; G06F 3/0613; G06F 3/0634; G06F 3/0659; G06F 3/0679; G06F 3/068; G11C 11/5628; G11C 16/0483; G11C 2211/5641
See application file for complete search history.

(56) References Cited

U.S. PATENT DOCUMENTS

| | | | | |
|---|---|---|---|---|
| 7,953,920 B2* | 5/2011 | Yano | ...................... | G06F 3/0631 711/103 |
| 8,886,911 B2* | 11/2014 | Nemazie | ............. | G06F 12/0871 711/171 |
| 10,331,555 B1* | 6/2019 | Muthiah | ................ | G06F 3/0613 |
| 2018/0211708 A1 | 7/2018 | Igahara et al. | | |
| 2020/0233967 A1* | 7/2020 | Mondello | ........... | G06F 11/1068 |

FOREIGN PATENT DOCUMENTS

WO 2012158514 A1 11/2012

OTHER PUBLICATIONS

Extended European Search Report for Patent Application No. 20181135.3, dated Nov. 23, 2020, 9 pages.

* cited by examiner

*Primary Examiner* — Idriss N Alrobaye
*Assistant Examiner* — Richard B Franklin
(74) *Attorney, Agent, or Firm* — Compass IP Law, PC

(57) ABSTRACT

Write performance of a block-based multi-level cell nonvolatile memory is increased through the use of an internal copy of blocks with a high validity. Write (program) performance for sequential workloads is increased by moving the data in blocks with a high validity within a NAND device directly from the portion of the NAND device configured as single level cell NAND to the portion of the NAND device configured as multi-level cell NAND.

16 Claims, 6 Drawing Sheets

METHOD AND APPARATUS TO IMPROVE WRITE BANDWIDTH OF A BLOCK-BASED MULTI-LEVEL CELL NONVOLATILE MEMORY

FIELD

This disclosure relates to multi-level cell block-based non-volatile memory and in particular to improving write bandwidth of block-based multi-level cell non-volatile memory.

BACKGROUND

Non-volatile memory refers to memory whose state is determinate even if power is interrupted to the device. Storage devices that include non-volatile memory include a secure digital card, a multimedia card, a flash drive (for example, a Universal Serial Bus (USB) flash drive also known as a "USB thumb drive" or "USB memory stick" that includes non-volatile memory with an integrated USB interface), and a solid-state drive.

A solid-state drive includes non-volatile memory to store data. The non-volatile memory can comprise a block addressable memory device, such as NAND, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND).

The NAND flash cell uses the threshold voltage of a floating-gate transistor to represent the data stored in the cell. In a SLC NAND flash memory, each memory cell has two voltage levels corresponding to two states (0, 1) to represent one bit. In a MLC, TLC and QLC NAND flash memory, each memory cell stores more than one bit. Each cell in a MLC NAND Flash memory uses four voltage levels corresponding to four states (00, 01, 10, 11) to represent 2 bits of binary data. Each cell in a TLC NAND Flash memory uses eight voltage levels corresponding to eight states (000 to 111) to represent 3 bits of binary data. Each cell in a QLC NAND Flash memory uses sixteen voltage levels corresponding to sixteen states (0000 to 1111) to represent 4 bits of binary data.

BRIEF DESCRIPTION OF THE DRAWINGS

Features of embodiments of the claimed subject matter will become apparent as the following detailed description proceeds, and upon reference to the drawings, in which like numerals depict like parts, and in which:

Figure 1:
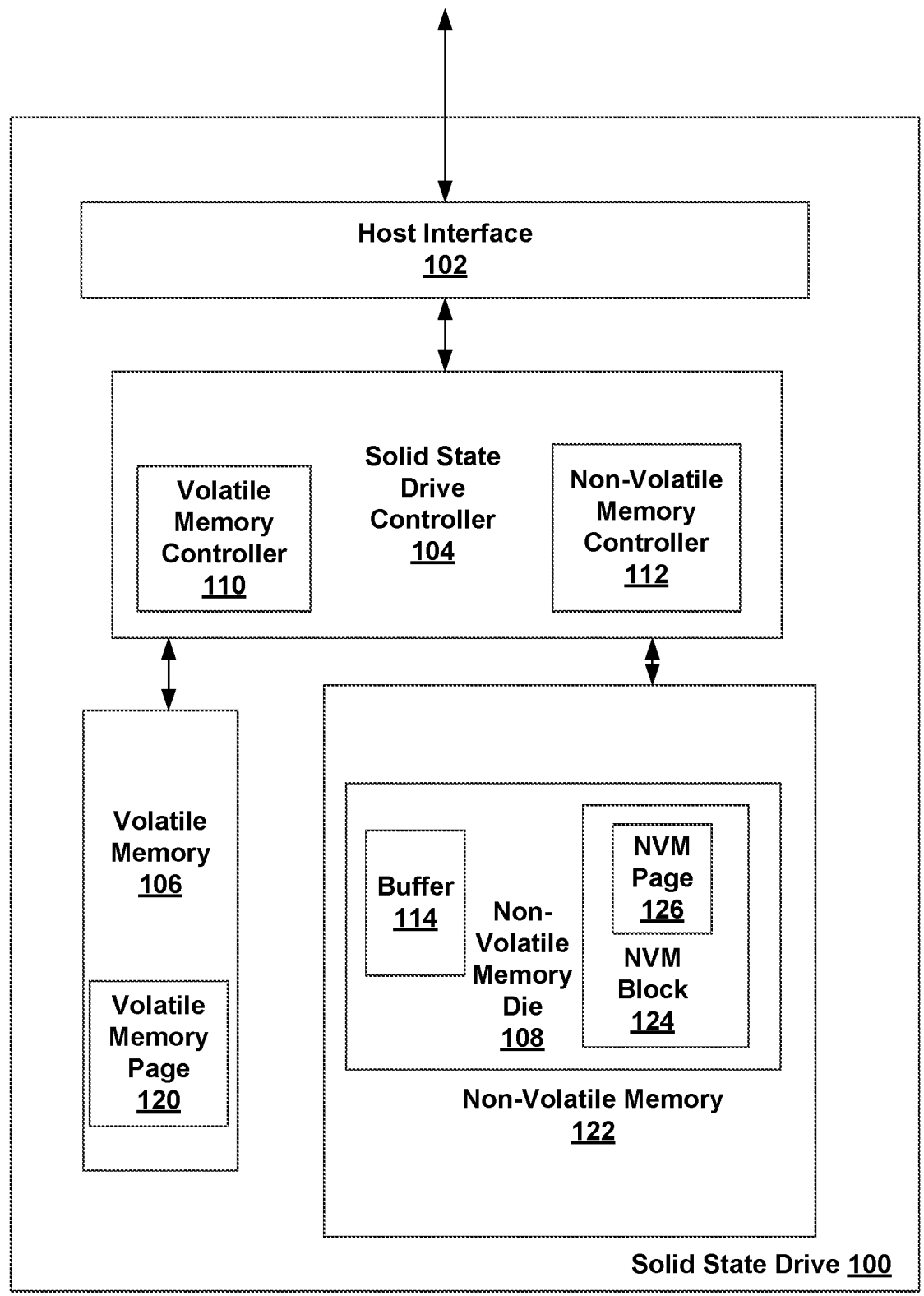
FIG. 1 is a block diagram of an embodiment of a solid-state drive.

Although the following Detailed Description will proceed with reference being made to illustrative embodiments of the claimed subject matter, many alternatives, modifications, and variations thereof will be apparent to those skilled in the art. Accordingly, it is intended that the claimed subject matter be viewed broadly, and be defined as set forth in the accompanying claims.

DESCRIPTION OF EMBODIMENTS

Accessing (reading/writing) a QLC NAND cell is slower than accessing a NAND cell that stores fewer bits because the multi-bit cell, that is, four bits per cell storage mode of QLC NAND requires discriminating between 16 different voltage levels. For example, data is written to a SLC cell in a single step and is written (programmed) to a QLC cell in multiple steps. The algorithm used in the NAND device to write the four bits of data to the QLC cell can write the four bits in two cycles or three cycles. For example, to write the four bits, the algorithm can write two bits and then write the other two bits or write three bits then write the fourth bit or write one bit, write two bits and then write the fourth bit.

To improve write bandwidth, typically data to be written to QLC NAND is first written to SLC NAND and then moved from the SLC NAND to QLC NAND because data written to the QLC cell can be corrupted if there is a sudden power failure before all of the write cycles (for example, two or three cycles) have been completed. The SLC NAND and QLC NAND can be separate NAND dies or portions of the same NAND die with one portion configured in SLC mode (single bit per cell mode) and another portion configured in QLC mode (four bits per cell mode).

Typically, data is moved from SLC NAND to QLC NAND (in separate NAND dies or portions of the same NAND die) by first moving the data from the SLC NAND to Dynamic Random Access Memory (DRAM) and then moving the data from the DRAM to the QLC NAND to write the data in two or three cycles to the QLC NAND.

First data is read from the portion of the NAND device configured as SLC NAND. Next the data is written to DRAM. Then, data is read from DRAM. Finally, data is written to the portion of the NAND device configured as QLC NAND. In a system that includes a NAND device with four channels and an Input/Output bandwidth of 800 Mega Bytes (MB) per second, and a DRAM device with an Input/Output bandwidth of 900 Mega Bytes (MB) per second, the write performance overhead can be about 15%.

In an embodiment, write (program) performance is increased by moving the data within a NAND device directly from the portion of the NAND device configured as SLC NAND to the portion of the NAND device configured as QLC.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

FIG. 1 is a block diagram of an embodiment of a solid-state drive 100. The solid-state drive 100 includes a host interface 102, a solid-state drive controller 104, volatile memory 106 and non-volatile memory 108. The volatile memory 106 includes a plurality of volatile memory pages 120.

A host system can communicate with the solid-state drive 100 via the host interface 102. In an embodiment, the host system communicates via the host interface 102 using Non-Volatile Memory Express (NVMe) standards. Non-Volatile Memory Express (NVMe) standards define a register level interface for host software to communicate with a Solid State Drive (SSD) over Peripheral Component Interconnect Express (PCIe), a high-speed serial computer expansion bus. The NVM Express standards are available at www.nvmexpress.org. The PCIe standards are available at pcisig.com.

The SSD controller 104 includes a volatile memory controller 110 and a non-volatile memory controller (an "off-die non-volatile memory controller") 112. The SSD controller 104 queues and processes commands (for example, read, write ("program"), erase commands for the non-volatile memory 122 and read and write commands for the volatile memory 106). The non-volatile memory 122 includes at least one non-volatile memory die 108, for example a NAND Flash die and the non-volatile memory die 108 includes a buffer 114 for temporarily storing data to be internally copied between blocks on the non-volatile memory die 108. Typically, data is written (striped) across many NAND Flash die in the SSD to optimize the write bandwidth.

The non-volatile memory 122 on the non-volatile memory die 108 includes a plurality of blocks, with each block 124 including a plurality of pages. Each page 126 in the plurality of pages to store data and associated metadata. In an embodiment, the non-volatile memory die 108 has 2048 blocks, each block 124 has 64 pages 126, and each page 126 can store 2048 bytes of data and 64 bytes of metadata.

NAND Flash memory has a long erase time because the Erase operation is performed per block. Typically, instead of erasing an entire block (for example, 64 pages) to rewrite one page in the block, the data is written to another page in another block and the data in the prior page is marked as invalid. A garbage collection operation is typically used to free this invalid memory page in the block. The validity of the block is dependent on the number of pages that have been rewritten to other blocks.

In addition to rewriting the page in another block to improve write bandwidth, a portion of the plurality of blocks in the NAND Flash memory can be configured in SLC mode because a write to a block 124 configured for one bit per cell in SLC mode is faster than a write to a block 124 configured for four bits per cell in QLC mode.

Figure 2:
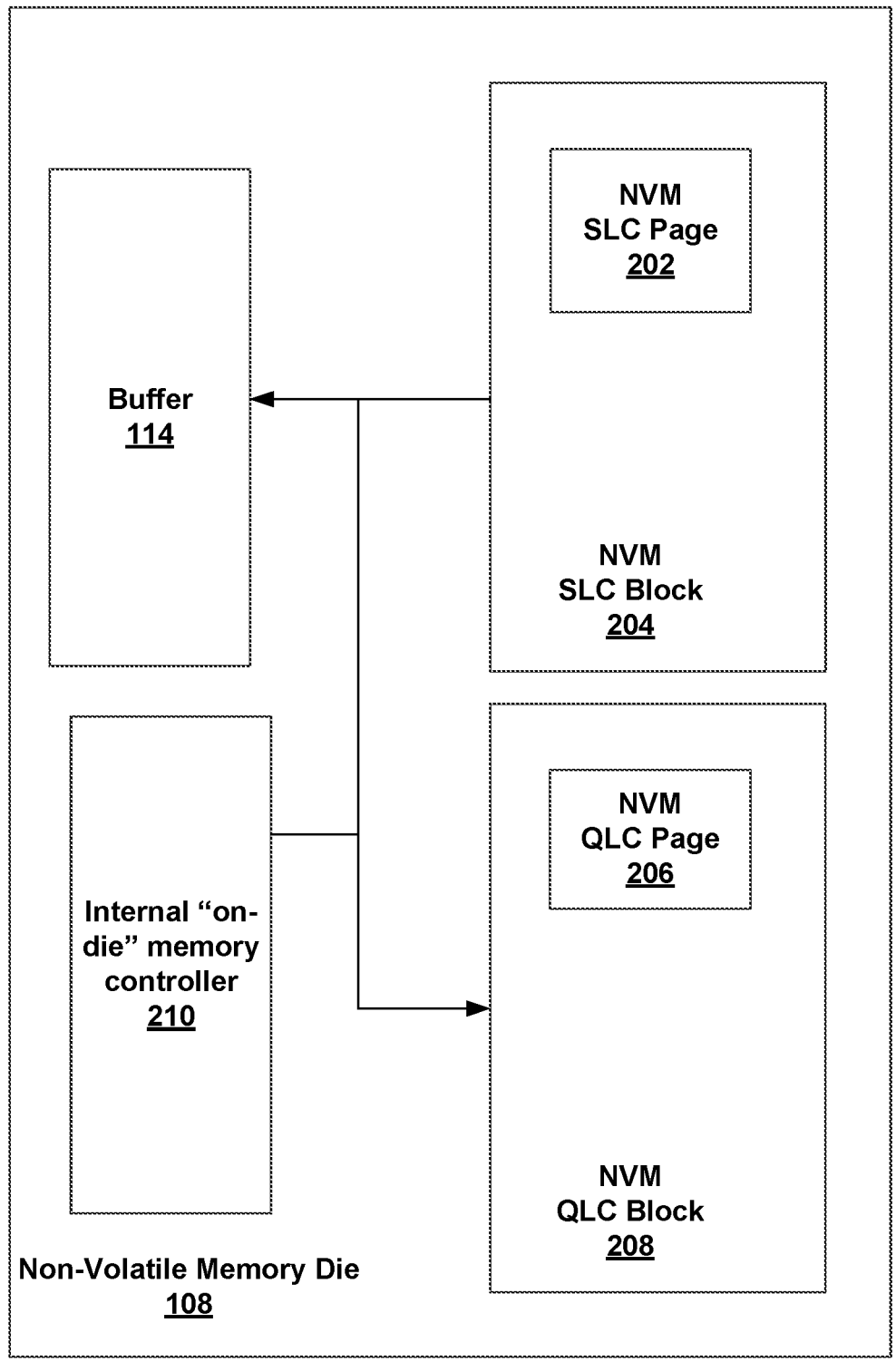
FIG. 2 is a block diagram of an embodiment of the NAND flash die shown in FIG. 1 that includes a buffer used to perform an internal copy from a block configured in SLC mode to a block configured in QLC mode.

FIG. 2 is a block diagram of an embodiment of the NAND flash die 108 shown in FIG. 1 that includes a buffer 114 and an internal memory controller (on-die memory controller) 210 used to perform an internal copy from a block configured in SLC mode 204 to a block configured in QLC mode 208.

The block configured in SLC mode 204 in the on-die non-volatile memory in the NAND flash die 108 includes a plurality of SLC pages 202 (a page configured in SLC mode). The block configured in QLC mode 206 in the on-die block erasable non-volatile memory in the NAND flash die 108 includes a plurality of QLC pages 206 (a page configured in QLC mode).

Four SLC blocks 204 can be stored in one QLC block 208 with four SLC pages 202 stored in one QLC page 206. Four SLC blocks 202 to be internally copied to a QLC block 208 are selected in the NVM die 108 and temporarily stored in buffer 114 prior to writing to the QLC block 208.

Figure 3:
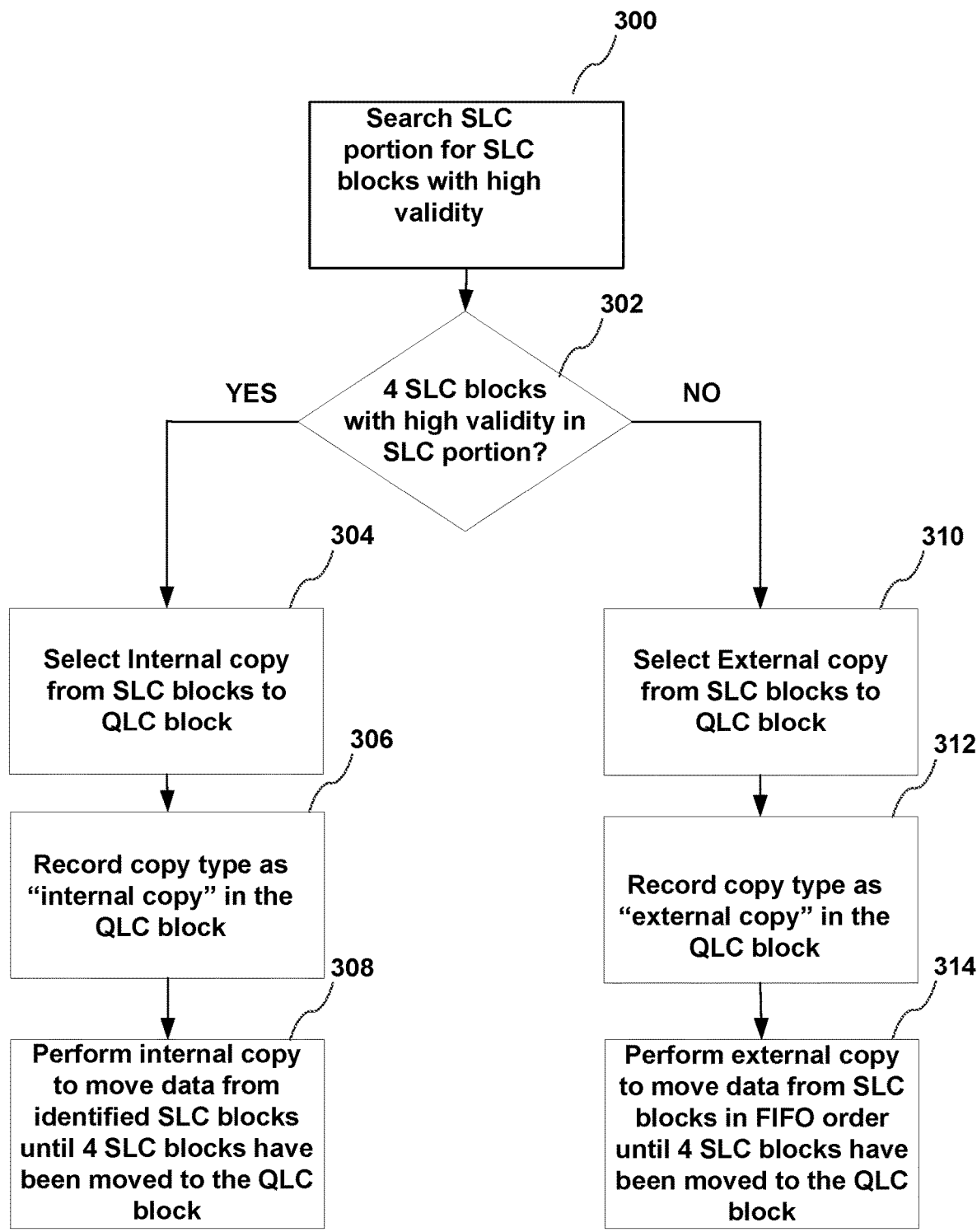
FIG. 3 is a flow graph of an embodiment of a method to move data stored in SLC blocks to a QLC block via an external or internal copy.

FIG. 3 is a flow graph of an embodiment of a method to move data stored in SLC blocks to a QLC block via an external or internal copy. Data stored in four SLC blocks in NAND flash memory can be moved from the four SLC blocks to a QLC block using an external copy via the volatile memory or an internal copy in the NAND flash memory via buffer 114.

The external data copy is typically referred to as "Defragmentation" or "Garbage collection" because only the valid data blocks (for example, the minimum logical unit size can be 4 Kilo Bytes in a solid-state drive including NAND with a page size of 16 Kilo Bytes (KB)) are moved from the SLC blocks to the QLC block. The external copy or garbage collection is efficient for random write workloads (that is, data being read is not stored in consecutive pages or blocks).

In response to a command received from the block erasable off-die non-volatile memory controller 112, the internal copy moves the entire content of the four SLC blocks (both valid and invalid pages) into a QLC block one page at a time. The internal copy back is efficient for sequential workload. In an embodiment, both the external copy mode and internal copy back mode are used together and the SSD controller 104 intelligently toggles between the two modes.

Each cell in a SLC NAND flash memory uses two voltage levels corresponding to two states (0, 1) to represent one bit of binary data. Each cell in a QLC NAND Flash memory uses sixteen voltage levels corresponding to sixteen states (0000 to 1111) to represent 4 bits of binary data. Thus, data that is stored in 4 SLC blocks can be copied to one QLC block.

At block 300, after opening an empty QLC block to write in the portion of NAND Flash memory that is configured as QLC, the SSD controller searches the portion of NAND Flash memory that is configured as SLC for SLC blocks with a maximum valid count. If the search can find at least 4 SLC blocks with a high validity (based on a validity threshold) then all 4 SLC blocks will be copied into QLC block using internal copy back. A block has high validity if a high percentage of pages store valid data. In an embodiment, a block has high validity if more than eighty percent of the pages in the block store valid data.

At block 302, if 4 SLC blocks with high validity are found in the NAND Flash memory, processing continues to block 304 to perform an internal copy in the NAND Flash memory. If not, processing continues with block 310 to perform an external copy from the 4 SLC blocks to the QLC block via the volatile memory 106. The volatile memory 106 to temporarily store data to be moved from the 4 SLC blocks to the QLC block.

At block 304, an internal copy in the NAND Flash memory from the identified 4 SLC blocks to a QLC block is selected.

At block 306, the copy type is recorded as "internal copy" in metadata in the QLC block.

At block 308, the internal copy to move data from identified SLC blocks until 4 SLC blocks have been moved to the QLC block is performed.

At block 310, an external copy from the 4 SLC blocks to a QLC block is selected.

At block 312, the copy type is recorded as "external copy" in metadata in the QLC block.

At block 314, an external copy via volatile memory is performed to move data from SLC blocks in First In First Out (FIFO) order until the 4 SLC blocks have been moved to the QLC block. The FIFO order is based on the timestamp stored in metadata in the SLC block that indicates the last time that the SLC block was written. The SLC block with the earliest timestamp (that is, the first written SLC block) is selected. FIFO order is chosen because it naturally selects the SLC blocks with the highest validity.

The internal copy has been described for an embodiment in which the data stored in four SLC blocks is moved to one QLC block. In other embodiments, the internal copy can be used to move contents of one SLC block to another SLC block or contents of one QLC block to another QLC block. In yet other embodiments, the internal copy can be used to move contents of a multi-level block to another multi-level block or a single-level block to another multi-level block.

Figure 4:
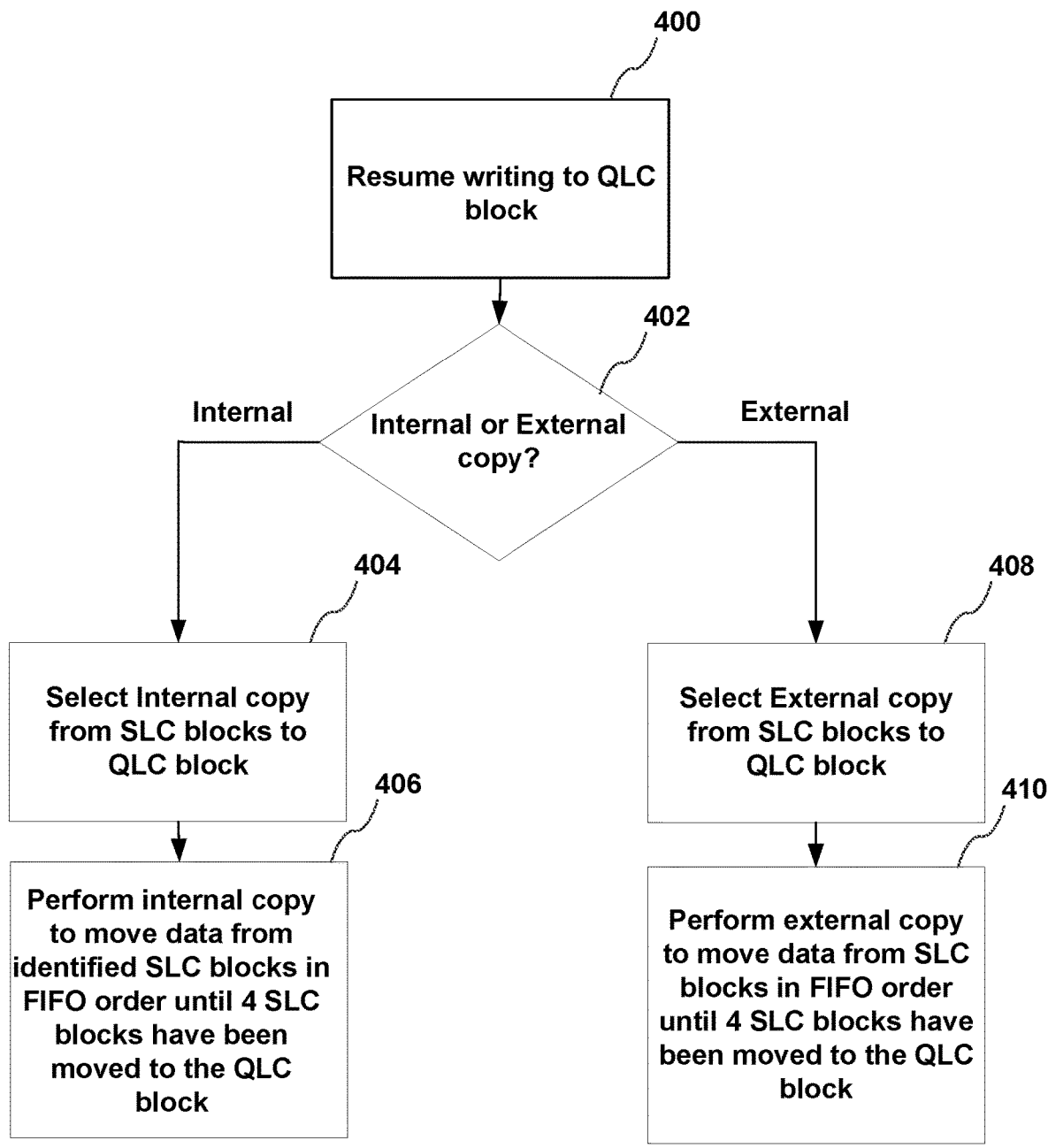
FIG. 4 is a flow graph of an embodiment of a method to resume move of data stored in SLC blocks to a QLC block via an external or internal copy.

FIG. 4 is a flow graph of an embodiment of a method to resume move of data stored in SLC blocks to a QLC block via an external or internal copy after an unexpected loss of power while data is in the process of being written to the QLC block. Typically, there is no power loss protection in a client SSD. For example, a client NVMe SSD can have three operational power states (Power State (PS) 0, PS1, PS2) each having a maximum power greater than 2 Watts and two non-operational power states (PS3, PS4) with maximum power less than 30 milliwatts. Operational power state PS0 is the highest power state and non-operational power state PS4 is the lowest power state.

Upon detection of the SSD entering a non-operational SSD power state (for example, PS3 or PS4 or shutdown), there can be insufficient power to complete the copy operation (internal or external) in the client SSD and the copy operation is paused while the SSD is in the non-operational power state.

At block 400, the SSD returns to an operational power state and resumes writing from the SLC blocks to the QLC block.

At block 402, the SSD controller reads the QLC block copy type stored in metadata in the QLC block that was in the process of being written when the SSD switched to one of the non-operational states. If the copy type is internal, processing continues with block 404. If the copy type is external, processing continues with block 408.

At block 404, an internal copy in the NAND Flash memory from the identified 4 SLC blocks to a QLC block is selected.

At block 406, the internal copy to move data from identified SLC blocks until 4 SLC blocks have been moved to the QLC block is performed.

At block 408, an external copy from the 4 SLC blocks to a QLC block is selected.

At block 410, an external copy via volatile memory is performed to move data from SLC blocks in First In First Out (FIFO) order until the 4 SLC blocks have been moved to the QLC block. The FIFO order is based on the timestamp stored in metadata in the SLC block that indicates the last time that the SLC block was written. The SLC block with the earliest timestamp (that is, the first written SLC block) is selected. FIFO order is chosen because it naturally selects the SLC blocks with the highest validity.

Figure 5:
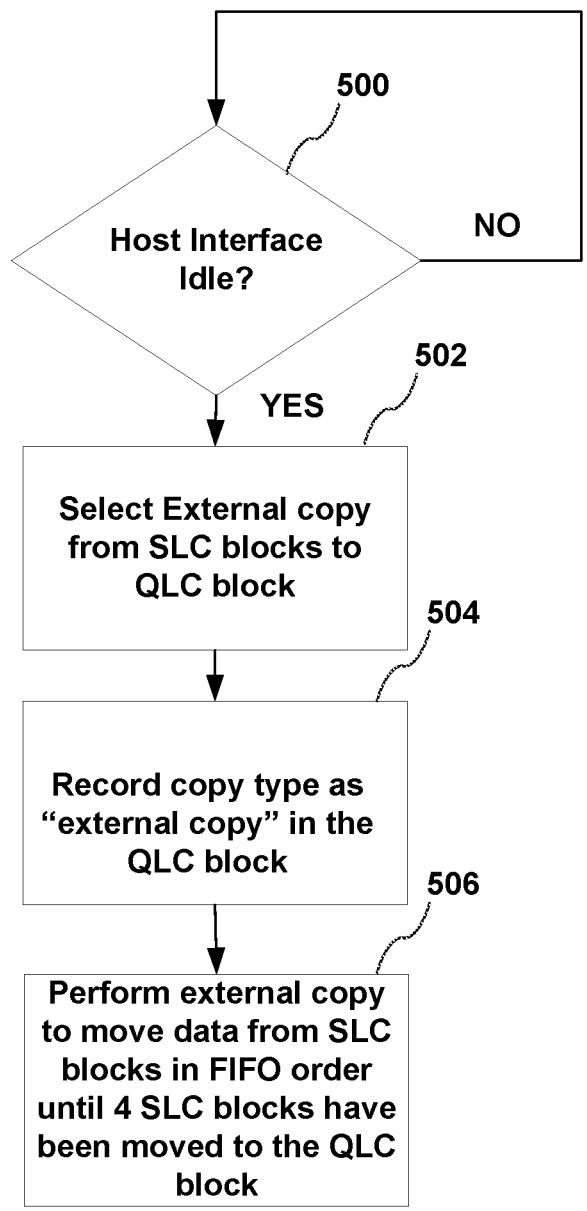
FIG. 5 is a flow graph of an embodiment of a method to resume move of data stored in SLC blocks to a QLC block via an external copy during host idle time.

FIG. 5 is a flow graph of an embodiment of a method to resume move of data stored in SLC blocks to a QLC block via an external copy during host idle time. Host idle time is an opportunity to move data from SLC blocks to a QLC block and free up SLC capacity for a write performance boost. The external copy based on validity discussed in conjunction with FIG. 3 can free up more SLC blocks than the internal copy discussed in conjunction with FIG. 3.

At block 500, if the host interface is idle, processing continues with block 502.

At block 502, an external copy from the 4 SLC blocks to a QLC block is selected.

At block 504, the copy type is recorded as "external copy" in metadata in the QLC block.

At block 506, an external copy via volatile memory is performed to move data from SLC blocks in First In First Out (FIFO) order until the 4 SLC blocks have been moved to the QLC block. The FIFO order is based on the timestamp stored in metadata in the SLC block that indicates the last time that the SLC block was written. The SLC block with the earliest timestamp (that is, the first written SLC block) is selected. FIFO order is chosen because it naturally selects the SLC blocks with the highest validity If the host interface is no longer idle is or the solid-state drive enters a non-operational power state (for example, in an embodiment of a solid-state drive with a PCIe interface, the PCIe interface enters device power state D3cold (a low-power device power state) or shutdown) before completing the move to the QLC block, the external copy discussed in conjunction with FIG. 4 is resumed when the host interface is idle or the SSD returns to an operational power state or and resumes writing from the SLC blocks to the QLC block. The use of the internal copy for SLC to QLC if source block validity is high improves write performance for sequential workloads in a solid-state drive.

Figure 6:
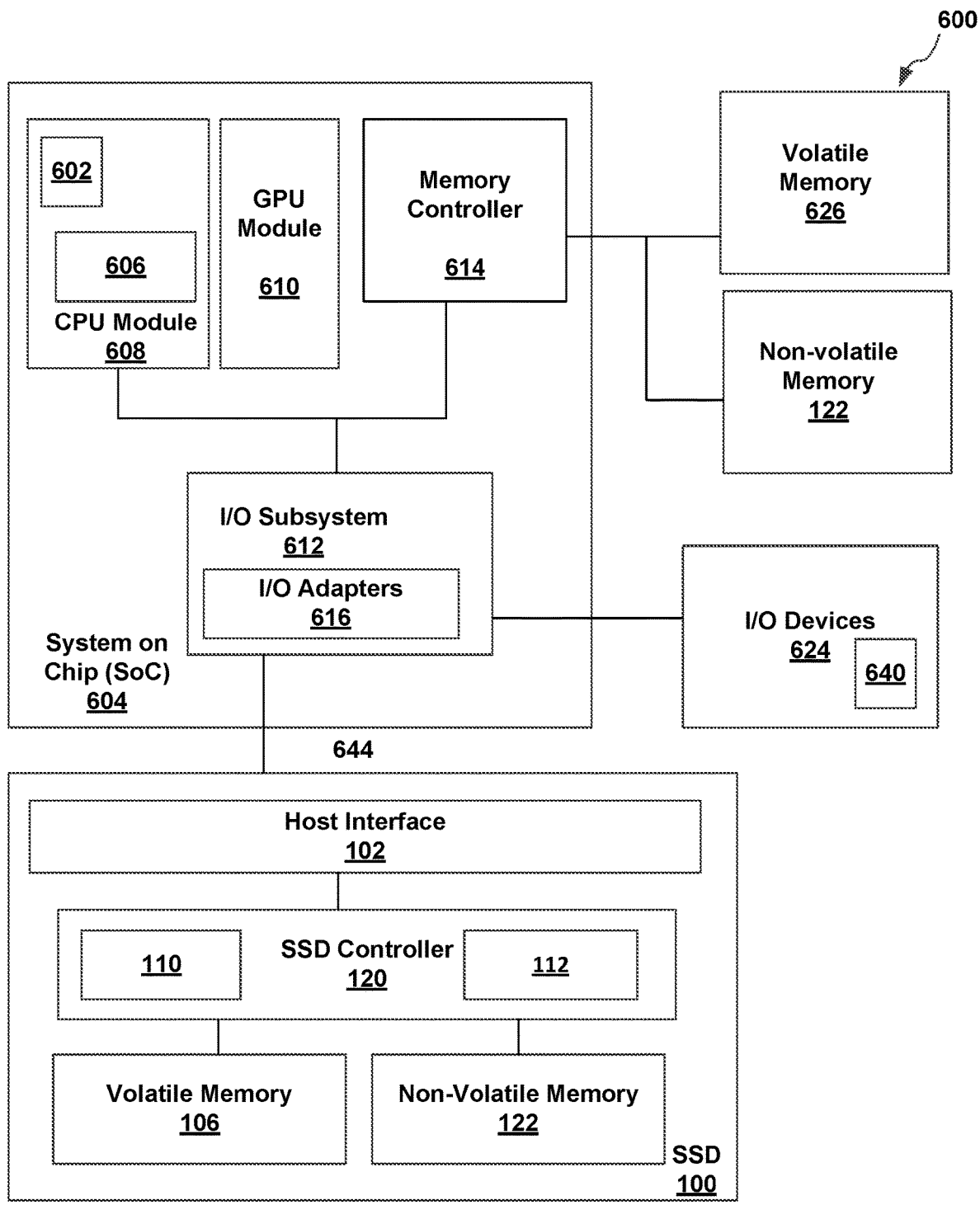
FIG. 6 is a block diagram of an embodiment of a computer system 600 that includes a block-erasable non-volatile memory that includes an internal ("on die") memory controller to transfer data directly from a single-level cell portion to a multi-level cell portion.

FIG. 6 is a block diagram of an embodiment of a computer system 600 that includes a block-erasable non-volatile memory 112 that includes an internal memory controller to transfer data directly from a single-level cell portion to a multi-level cell portion. Computer system 600 can correspond to a computing device including, but not limited to, a server, a workstation computer, a desktop computer, a laptop computer, and/or a tablet computer.

The computer system 600 includes a system on chip (SOC or SoC) 604 which combines processor, graphics, memory, and Input/Output (I/O) control logic into one SoC package. The SoC 604 includes at least one Central Processing Unit (CPU) module 608, a memory controller 614, and a Graphics Processor Unit (GPU) 610. In other embodiments, the memory controller 614 can be external to the SoC 604. The CPU module 608 includes at least one processor core 602 and a level 2 (L2) cache 606.

The memory controller 614 can be communicatively coupled to a volatile memory 626 and/or a non-volatile memory 122. The non-volatile memory 122 includes a block-erasable non-volatile memory that includes an internal memory controller to transfer data directly from a single-level cell portion to a multi-level cell portion as discussed in conjunction with FIGS. 1-5.

Although not shown, each of the processor core(s) 602 can internally include one or more instruction/data caches, execution units, prefetch buffers, instruction queues, branch address calculation units, instruction decoders, floating point units, retirement units, etc. The CPU module 608 can correspond to a single core or a multi-core general purpose processor, such as those provided by Intel® Corporation, according to one embodiment.

The Graphics Processor Unit (GPU) 610 can include one or more GPU cores and a GPU cache which can store graphics related data for the GPU core. The GPU core can internally include one or more execution units and one or more instruction and data caches. Additionally, the Graphics Processor Unit (GPU) 610 can contain other graphics logic units that are not shown in FIG. 6, such as one or more vertex processing units, rasterization units, media processing units, and codecs.

Within the I/O subsystem 612, one or more I/O adapter(s) 616 are present to translate a host communication protocol utilized within the processor core(s) 602 to a protocol compatible with particular I/O devices. Some of the protocols that adapters can be utilized for translation include Peripheral Component Interconnect (PCI)-Express (PCIe); Universal Serial Bus (USB); Serial Advanced Technology Attachment (SATA) and Institute of Electrical and Electronics Engineers (IEEE) 1594 "Firewire".

The I/O adapter(s) 616 can communicate with external I/O devices 624 which can include, for example, user interface device(s) including a display and/or a touch-screen display 640, printer, keypad, keyboard, communication logic, wired and/or wireless, storage device(s) including hard disk drives ("HDD"), solid-state drives ("SSD"), removable storage media, Digital Video Disk (DVD) drive, Compact Disk (CD) drive, Redundant Array of Independent Disks (RAID), tape drive or other storage device. The storage devices can be communicatively and/or physically coupled together through one or more buses using one or more of a variety of protocols including, but not limited to, SAS (Serial Attached SCSI (Small Computer System Interface)), PCIe (Peripheral Component Interconnect Express), NVMe (NVM Express) over PCIe (Peripheral Component Interconnect Express), and SATA (Serial ATA (Advanced Technology Attachment)).

The display 640 is communicatively coupled to a processor core processor core 602 to display data stored in the block erasable non-volatile memory die 122.

Additionally, there can be one or more wireless protocol I/O adapters. Examples of wireless protocols, among others, are used in personal area networks, such as IEEE 802.15 and Bluetooth, 4.0; wireless local area networks, such as IEEE 802.11-based wireless protocols; and cellular protocols.

The I/O adapter(s) 616 can also communicate with a solid-state drive ("SSD") 100 which includes a SSD controller 104, a host interface 102 and non-volatile memory 122 that includes one or more non-volatile memory devices. Commands (for example, read, write ("program"), erase commands for the non-volatile memory 122) are queued and processed by the SSD controller 104.

The non-volatile memory 122 includes a block-erasable non-volatile memory that includes an internal memory controller to transfer data directly from a single-level cell portion to a multi-level cell portion as discussed in conjunction with FIGS. 1-5.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also include a byte-addressable write-in-place three dimensional crosspoint memory device, or other byte addressable write-in-place NVM devices (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

The I/O adapters 616 can include a Peripheral Component Interconnect Express (PCIe) adapter that is communicatively coupled using the NVMe (NVM Express) over PCIe (Peripheral Component Interconnect Express) protocol over bus 644 to a host interface 102 in the solid-state drive 100. Non-Volatile Memory Express (NVMe) standards define a register level interface for host software to communicate with a non-volatile memory subsystem (for example, a Solid-state Drive (SSD)) over Peripheral Component Interconnect Express (PCIe), a high-speed serial computer expansion bus). The NVM Express standards are available at www.nvmexpress.org. The PCIe standards are available at www.pcisig.com.

Volatile memory is memory whose state (and therefore the data stored in it) is indeterminate if power is interrupted to the device. Dynamic volatile memory requires refreshing the data stored in the device to maintain state. One example of dynamic volatile memory includes DRAM (Dynamic Random Access Memory), or some variant such as Synchronous DRAM (SDRAM). A memory subsystem as described herein can be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory, JESD325, originally published by JEDEC in October 2013, DDR5 (DDR version 5, currently in discussion by JEDEC), LPDDR5 (currently in discussion by JEDEC), HBM2 (HBM version 2), currently in discussion by JEDEC, or others or combinations of memory technologies, and technologies based on derivatives or extensions of such specifications. The JEDEC standards are available at www.jedec.org.

An operating system 142 is software that manages computer hardware and software including memory allocation and access to I/O devices. Examples of operating systems include Microsoft® Windows®, Linux®, iOS® and Android®.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope.

Therefore, the illustrations and examples herein should be construed in an illustrative, and not a restrictive sense. The scope of the invention should be measured solely by reference to the claims that follow.

What is claimed is:

1. An apparatus comprising:
   a non-volatile memory die communicatively coupled to an off-die non-volatile memory controller, the non-volatile memory die comprising:
   an on-die memory controller;
   a plurality of first portions of memory, each first portion configured in a single bit per cell mode;
   a second portion of memory configured in a multi-bit per cell mode, the on-die memory controller to internally move valid pages and invalid pages directly from the plurality of first portions of memory to the second portion of memory in response to a command received from the off-die non-volatile memory controller if validity of data in each of the plurality of first portions of memory is greater than a validity threshold; and
   a volatile memory, the volatile memory to temporarily store data to be moved externally from the first portion to the second portion of memory if validity of data in each of the plurality of first portions of memory is less than the validity threshold instead of internally moving data directly in the non-volatile memory die, wherein the apparatus is a solid-state drive, the solid-state drive comprising a solid-state drive controller, the solid-state drive controller comprising the off-die non-volatile memory controller, and an off-die volatile memory controller.

2. The apparatus of claim 1, wherein the non-volatile memory is NAND.

3. The apparatus of claim 2, wherein the second portion of memory is configured for at least two bits per cell and the plurality of first portions of memory is two.

4. The apparatus of claim 2, wherein the second portion of memory is a Quad-Level Cell (QLC) block configured for four bits per cell and the plurality of first portions of memory is four Single-Level Cell (SLC) blocks, the on-die memory controller to internally move entire content of the four SLC blocks into the QLC block, one page at a time.

5. The apparatus of claim 1, wherein the validity threshold is at least eighty percent.

6. A method comprising:
   storing data in a plurality of first portions of an on-die non-volatile memory, each first portion configured in a single bit per cell mode;
   in response to a command received from an off-die non-volatile memory controller, if validity of data in each of the plurality of first portions is greater than a validity threshold, internally moving, by an on-die memory controller, valid pages and invalid pages directly from the plurality of first portions to a second portion of memory of the on-die non-volatile memory, the second portion of memory configured in a multi-bit per cell mode; and
   temporarily storing, in a volatile memory, data to be moved externally from the first portion to the second portion of memory if validity of data in each of the plurality of first portions is less than the validity threshold instead of internally moving data directly in the on-die non-volatile memory.

7. The method of claim 6, wherein the on-die non-volatile memory is NAND.

8. The method of claim 7, wherein the second portion of memory is configured for at least two bits per cell and the plurality of first portions is two.

9. The method of claim 7, wherein the second portion of memory is a Quad-Level Cell (QLC) block configured for four bits per cell and the plurality of first portions is four Single-Level Cell (SLC) blocks, the on-die memory controller to internally move entire content of the four SLC blocks into the QLC block, one page at a time.

10. The method of claim 6, wherein the validity threshold is at least eighty percent.

11. The method of claim 6, wherein the on-die memory controller, the off-die non-volatile memory controller, the plurality of first portions and the second portion of memory are in a solid-state drive.

12. A system comprising: an off-die non-volatile memory controller; and
    a non-volatile memory die communicatively coupled to the off-die non-volatile memory controller, the non-volatile memory die comprising:
    an on-die memory controller;

a plurality of first portions of memory, each first portion configured in a single bit per cell mode; and a second portion of memory configured in a multi-bit per cell mode, the on-die memory controller to internally move valid pages and invalid pages directly from the plurality of first portions of memory to the second portion of memory in response to a command received from the off-die non-volatile memory controller if validity of data in each of the plurality of first portions of memory is greater than a validity threshold;

a volatile memory, the volatile memory to temporarily store data to be moved externally from the first portion to the second portion of memory if validity of data in each of the plurality of first portions of memory is less than the validity threshold instead of internally moving data directly in the non-volatile memory die; and a display communicatively coupled to a processor to display data stored in the non-volatile memory die.

13. The system of claim 12, wherein the non-volatile memory is NAND.

14. The system of claim 13, wherein the second portion of memory is configured for at least two bits per cell and the plurality of first portions of memory is two.

15. The system of claim 13, wherein the second portion of memory is a Quad-Level Cell (QLC) block configured for four bits per cell and the plurality of first portions of memory is four Single-Level Cell (SLC) blocks, the on-die memory controller to internally move entire content of the four SLC blocks into the QLC block, one page at a time.

16. The system of claim 12, wherein the validity threshold is at least eighty percent.

* * * * *